(12) United States Patent
Watson et al.

(10) Patent No.: US 7,300,725 B2
(45) Date of Patent: Nov. 27, 2007

(54) METHOD FOR DETERMINING AND CORRECTING RETICLE VARIATIONS

(75) Inventors: Sterling G. Watson, Palo Alto, CA (US); Ady Levy, Sunnyvale, CA (US); Chris A. Mack, Austin, TX (US); Stanley E. Stokowski, Danville, CA (US); Zain K. Saidin, San Mateo, CA (US)

(73) Assignee: KLA-Tencor Technologies Corporation, Milpitas, CA (US)

( * ) Notice: Subject to any disclaimer, the term of this patent is extended or adjusted under 35 U.S.C. 154(b) by 0 days.

(21) Appl. No.: 11/394,177

(22) Filed: Mar. 29, 2006

(65) Prior Publication Data

US 2006/0234145 A1 Oct. 19, 2006

Related U.S. Application Data

(60) Provisional application No. 60/671,169, filed on Apr. 13, 2005.

(51) Int. Cl.
*G03F 9/00* (2006.01)

(52) U.S. Cl. .......................... 430/5; 430/30; 430/945; 382/144

(58) Field of Classification Search .................... 430/5, 430/30, 945; 382/144
See application file for complete search history.

(56) References Cited

U.S. PATENT DOCUMENTS

| 5,573,875 | A | 11/1996 | Kaplan et al. |
|---|---|---|---|
| 6,376,132 | B1 | 4/2002 | Yamashita |
| 6,516,085 | B1 | 2/2003 | Wiley et al. |
| 6,654,489 | B2 | 11/2003 | Wiley et al. |
| 7,123,356 | B1 | 10/2006 | Stokowski et al. |
| 2002/0036273 | A1 | 3/2002 | Okino |
| 2004/0009416 | A1 | 1/2004 | Peterson et al. |
| 2004/0091142 | A1 | 5/2004 | Peterson et al. |
| 2005/0084767 | A1* | 4/2005 | Zait et al. ....................... 430/5 |
| 2006/0236294 | A1 | 10/2006 | Saidin et al. |

FOREIGN PATENT DOCUMENTS

WO PCT/IL2004/000653 1/2005

OTHER PUBLICATIONS

Int'l Application No. PCT/US06/12741, Search Report dated Nov. 28, 2006.
Int'l Application No. PCT/US06/12741, Written Opinion dated Nov. 28, 2006.

* cited by examiner

*Primary Examiner*—Christopher G. Young
(74) *Attorney, Agent, or Firm*—Beyer Weaver LLP

(57) ABSTRACT

Disclosed are techniques for determining and correcting reticle variations using a reticle global variation map generated by comparing a set of measured reticle parameters to a set of reference reticle parameters. The measured reticle parameters are obtained by reticle inspection, and the variation map identifies reticle regions and associated levels of correction. In one embodiment, the variation data is communicated to a system which modifies the reticle by embedding scattering centers within the reticle at identified reticle regions, thereby improving the variations. In another embodiment the variation data is transferred to a wafer stepper or scanner which in turn modifies the conditions under which the reticle is used to manufacture wafers, thereby compensating for the variations and producing wafers that are according to design.

13 Claims, 5 Drawing Sheets

METHOD FOR DETERMINING AND CORRECTING RETICLE VARIATIONS

CROSS REFERENCE TO RELATED APPLICATION

The present application claims priority under 35 U.S.C. 119(e) to U.S. Provisional Patent Application No. 60/671, 169 for METHOD FOR DETERMINING AND CORRECTING RETICLE VARIATIONS filed on Apr. 13, 2005, by Sterling G. Watson, et al., the entire disclosure of which is incorporated herein by reference for all purposes.

FIELD OF INVENTION

The invention pertains in general to integrated circuit design and fabrication, and in particular to inspecting and correcting reticle variations.

BACKGROUND

Fabricating semiconductor devices such as logic and memory devices typically includes processing a substrate such as a semiconductor wafer using a number of semiconductor fabrication processes to form various features and multiple levels of the semiconductor devices. For example lithography is a semiconductor fabrication process that involves transferring a pattern from a reticle to a resist arranged on a semiconductor wafer. Additional examples of semiconductor fabrication processes include, but are not limited to, chemical-mechanical polishing, etch, deposition, and ion implantation. Multiple semiconductor devices may be fabricated in an arrangement on a semiconductor wafer and then separated into individual semiconductor devices.

Lithography is typically one of the most important processes in integrated circuit manufacturing since this is the process in which features are patterned on the wafer. The pattern printed in a resist by lithography is then utilized as a masking layer to transfer the pattern to additional layers on the wafer in subsequent processing steps. Therefore, the pattern that is formed on the wafer during lithography directly affects the features of the integrated circuits that are formed on the wafer. Consequently, defects that are formed on the wafer during lithography may be particularly problematic for the integrated circuit manufacturing process. One of the many ways in which defects may be formed on the patterned wafer during lithography is by transfer of defects that are present on the reticle to the wafer. Therefore, detection and correction of defects on the reticle such as unwanted particulate or other matter are performed rather stringently to prevent as many defects on the reticle from being transferred to the wafer during lithography.

Accordingly, improved mechanisms for correcting problems or variations on the reticle are needed.

SUMMARY OF THE INVENTION

Systems and methods are disclosed for determining and correcting reticle variations. A reticle global variation map is generated by comparing a set of measured reticle parameters (such as CD, shape, dose, bias, gain, transmission or other relevant parameters) to a set of reference reticle parameters. The set of measured reticle parameters are obtained, for a set of reticle regions, using a reticle inspection system. The set of reference reticle parameters may be based on a design database, based on a reference die on the reticle, or calculated from prior reticle parameter measurements.

The reticle global variation map is then used to correct detected variations in order to improve global parameter uniformity across the reticle. In one embodiment, the variation data is communicated to a system which modifies the reticle in order to improve the variations.

In another embodiment, the variation data is transferred to a system, such as a wafer stepper or scanner, which modifies the conditions under which the reticle is used to manufacture wafers, thereby compensating for the variations and producing wafers that are according to design. One such example comprises modifying the dose in a scanner, in the scan direction and along the scanner slit, based on the variation data obtained by reticle inspection.

In one embodiment, the invention pertains to a method for determining and correcting reticle variations. Measured features of a reticle are compared to reference features. A reticle global variation is determined based on the comparison. The reticle global variation indicates how a parameter of the measured features varies across the reticle. One or more reticle regions for dose correction are identified based on the determined reticle global variation and one or more levels of dose correction are associated with the one or more identified reticle regions. Dose correction is applied to the one or more reticle regions according to the associated one or more levels of dose correction so as to minimize the reticle global variation. The applying operation includes embedding scattering centers into the reticle at the identified one or more reticle regions.

In one implementation, the operation of embedding scattering centers is accomplished by using a femto-second laser. In another aspect, the reference features are obtained from a design database. In yet another aspect, the measured features of the reticle are measured on a first die of the reticle and the reference features are measured on a second die of the reticle. In another aspect, the reference features are previously measured on a second reticle having ideal characteristics. In one aspect, the reticle regions are on a millimeter scale.

In a specific application, the parameter is critical dimension (CD). When the CD of a first reticle region is greater than a CD of the corresponding reference region, the dose correction for such first reticle region specifies a decrease in the dose level so as to decrease the CD of the first reticle region to substantially match the CD of the corresponding reference region. In another aspect, When the CD of a first reticle region is less than a CD of the corresponding reference region and the CD of a second reticle region is not less than a CD of the corresponding reference region, the dose correction for the second reticle region specifies a decrease in the dose level for the second reticle region. In this aspect, an increase in the dose level applied to the entire reticle, including the first and second reticle regions, is specified so that the resulting dose level that transmits through the first region increases so as to increase the CD of the first region to substantially match the CD of the corresponding reference region and the resulting dose level that transmits through the second reticle region remains the same.

In another method embodiment, a process window is provided for each of the reticle regions. Each process window specifies a range of lithography parameters for which the corresponding reticle region prints a particular wafer region that is within a predetermined specification. One or more scattering centers are embedded within a first one of the reticle regions so as to widen the first reticle region's corresponding process window. The scattering centers are sized and positioned to alter a transmission property of the first reticle region.

In a further aspect, the operation of embedding one or more scattering centers is performed so as to increase an overlap between the first reticle region's corresponding process window and at least a second reticle's corresponding process window. In another embodiment, the operation of embedding one or more scattering centers is accomplished by using a femto-second laser. In yet another aspect, the scattering centers are sized and positioned so as to decrease the amount of illumination through the first reticle region to thereby allow an increase in dose level of the first reticle region's process window.

BRIEF DESCRIPTION OF THE DRAWINGS

The present invention is illustrated by way of example, and not by way of limitation, in the figures of the accompanying drawings and in which like reference numerals refer to similar elements and in which.

DETAILED DESCRIPTION OF THE INVENTION

Figure 1:
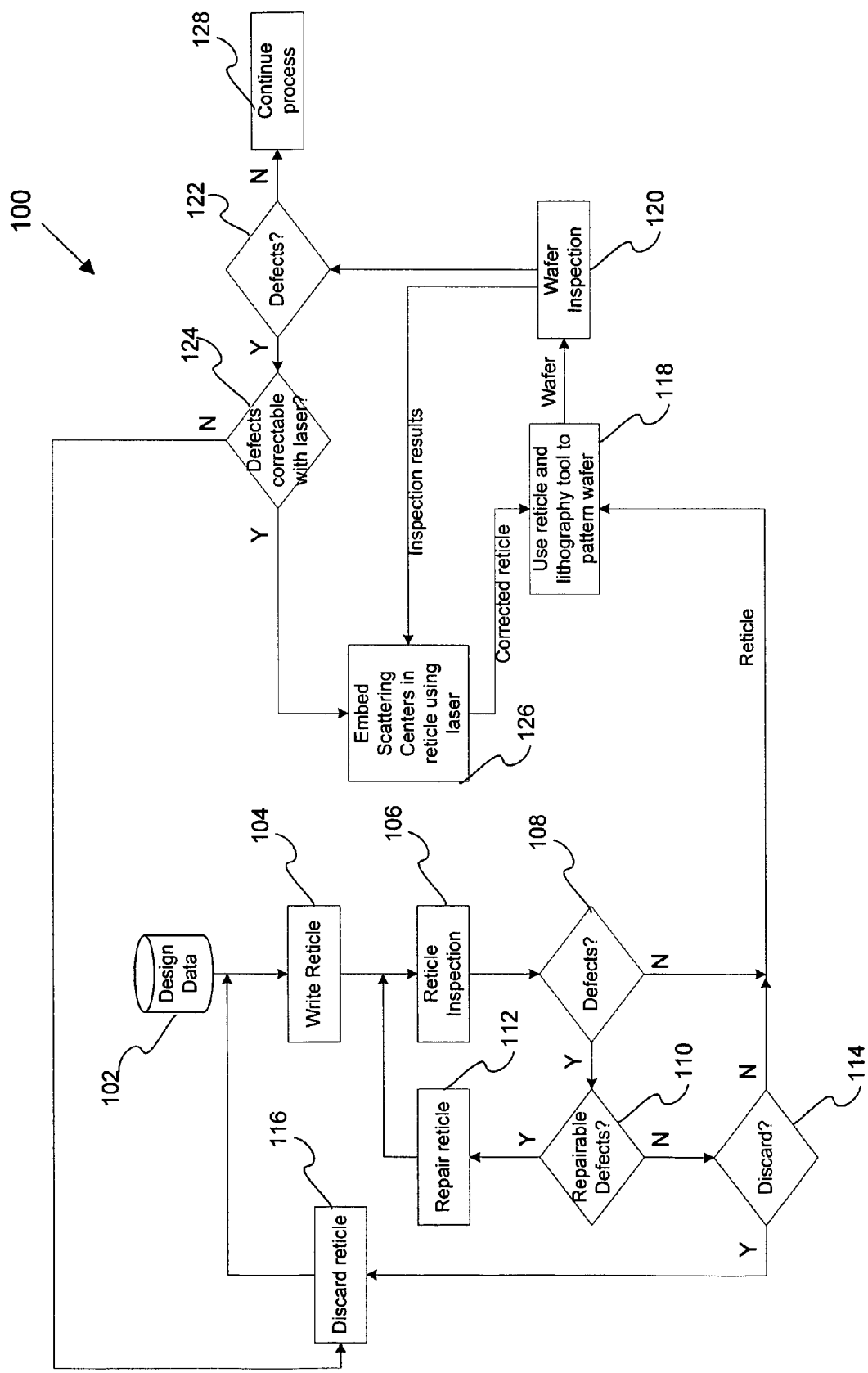
FIG. 1 is a flow diagram illustrating an integrated circuit (IC) device design process in which a laser may be utilized to change the optical properties of a reticle, in accordance with various embodiments of the present invention.

Reference will now be made in detail to a particular embodiment of the invention, examples of which are illustrated in the accompanying drawings. While the invention will be described in conjunction with the particular embodiments, it will be understood that it is not intended to limit the invention to the described embodiments. To the contrary, it is intended to cover alternatives, modifications, and equivalents as may be included within the spirit and scope of the invention as defined by the appended claims.

The terms "reticle" and "mask" are used interchangeably herein. A reticle generally includes a transparent substrate such as glass, borosilicate glass, and fused silica having a layer of opaque or partially transmitting material formed thereon. A reticle may include additional materials formed under the opaque material such as an adhesion layer. In addition, a reticle may include additional materials formed on top of the opaque material such as a bottom anti-reflective coating, a resist (or "photoresist"), and a top anti-reflective layer. The opaque regions may be replaced by regions etched into the transparent substrate.

Patterned reticles are generated to be used as photomasks in the production of semiconductor and other devices. The patterns on a reticle are generally described in a "design database" and may comprise features for optical proximity correction (OPC). Once a reticle is written (i.e. manufactured) and comprises a set of patterns according to a design database, the written reticle patterns are compared to the design database to ensure that the written reticle patterns have been reproduced with sufficient fidelity, wherein the fidelity can be expressed using a set of parameters such as critical dimension and critical shapes. The present invention describes systems and methods for determining and correcting variations of reticle parameters.

Introduction

The present invention generally includes techniques for using a laser to correct or change one or more optical properties, such as a transmission level, at one or more specific regions in a reticle. One such laser apparatus is further described in International Application having Application No. PCT/IL2004/000653, filed 18 Jul. 2004, entitled "METHOD FOR CORRECTING CRITICAL DIMENSION VARIATIONS IN PHOTOMASKS" by Eitan et al, and U.S. Provisional Application No. 60/488,717, filed 18 Jul. 2003. These applications are incorporated herein by reference in their entirety for all purposes. In one example, CD variation is corrected by using a laser to form "scattering elements" (SEs) that are embedded within the reticle to obtain varying amounts of light transmission or dose through the reticle. In one specific example, a femto-second laser available from UC-Laser Technologies of Karmiel Israel may be used. The SEs are specific volumes of damage that are created with the laser at various positions embedded within the reticle to thereby alter the transmission levels through the reticle at particular regions of the reticle. An increase in the number of SEs created in a given region results in a reduction in dose through such region in the reticle, as compared with another region with fewer SEs. Thus, one region of the reticle can have a different dose than another region on the reticle as a result of specific SE placement by the laser. In one application of the laser, the resulting dose variation of the reticle is selected to cause a more uniform distribution of CD across the resulting wafer.

FIG. 1 is a flow diagram illustrating an integrated circuit (IC) device design process 100 in which a laser may be utilized to change the optical properties (e.g., reduce CD variation) of a reticle in accordance with various embodiments of the present invention. To provide a simplified introduction to basic concepts of the present invention, the following process 100 will initially be described in the context of using a laser only to correct CD variation that is indicated by a wafer inspection. Later described embodiments include various alternative applications of such laser to correct or change numerous types of optical properties, including dose variation, at various stages of the design process. This initial introduction is merely illustrative and is not meant to limit the scope of the invention.

Initially, design data is received at step 102. Design data may include any portion of an IC design for implementation in the IC device. The IC design can be developed using any number of suitable design techniques. For example, a designer may create the IC design by using preexisting schematic library blocks from various electronic design automation (EDA) tools. In some cases, the designer may create the IC design or part of the IC design from scratch with the aid of any suitable design system, such as conventional computer aided design (CAD) tools. For example, the designer may use a schematic CAD tool to plan the logic diagrams for a particular IC design. Still further, the designer may write a description of the IC design or portions of the IC design with the aid of a hardware design language, such as VHDL.

The IC design is generally converted into design data that is in a suitable format that allows a pattern corresponding to the IC design to be produced onto a reticle. For instance, design data may be in a GDSII format. Design data may also be in a format of a database, such as a circuit layout pattern database that is generated from the IC design using any suitable tool, for example, by using EDA or CAD tools. The circuit layout pattern database is composed of a plurality of electronic representations of layout patterns for IC layers that are converted into a plurality of reticles that are used to fabricate a plurality of physical layers of an IC device. Each physical layer of the fabricated IC device corresponds to one of the reticles and an associated one of the electronic representations of the circuit pattern database. For example, one electronic representation may correspond to a diffusion pattern on a silicon substrate, another to a gate oxide pattern, another to a gate polysilicon pattern, another to a contact pattern on an interlayer dielectric, another to a line pattern on a metallization layer, and so on. Each electronic representation is composed of a plurality of polygons or other shapes, which together define the reticle pattern.

After the design data is received, the design data is used to write a reticle at step 104. The reticle may be written using any suitable pattern generator or reticle writer equipment, such as a vector scan E-beam tool model EBM-4500, which is commercially available from Nuflare Technology Inc., Japan. The reticle corresponds to one or more electronic representation(s) from the design data. The reticle is then inspected at step 106, and it is determined whether the reticle has any defects at step 108. Defects are defined herein as any discrepancy on the reticle, including missing material, extraneous material, variations in critical dimension (CD) across the reticle, etc. That is, a defect is generally any characteristic of the reticle that fails to meet an expected or ideal requirement.

If the reticle has no defects, the reticle is used along with one or more lithography tools (e.g., scanner, stepper, etc.) to pattern the wafer (e.g., the reticle is used to fabricate a physical layer of the IC device by transferring the reticle pattern onto a photoresist covering the wafer and then etch such pattern onto an underlying device layer of the wafer) at step 118. However, if the reticle has a defect, a determination is made as to whether the defect is repairable at step 110. A repairable defect may be defined according to any suitable guideline or specification. For instance, localized defects (e.g., extra pattern material on the reticle; missing pattern material on the reticle) in the reticle pattern can be deemed repairable. In some embodiments, the repairable defects are confined to a substantially limited area of the reticle pattern.

If the defect is repairable, the repairs are made at step 112 and the repaired reticle is then inspected again at step 106. If the defect is not repairable, it is then determined whether the reticle should be discarded at step 114. In certain cases, even when the reticle defects are not eliminated (or repaired) in the reticle pattern itself, the reticle may still be usable as further described below. If the reticle is not usable, then the reticle is discarded at step 116 and another reticle is written in operation 104. For instance, changes may be made to the design data, or the reticle writing process may be adjusted, in order to produce a non-defective reticle. If the determination in operation 114 is negative, then the inspected reticle can be used along with any suitable type of lithography tool to pattern the wafer at step 118.

After the wafer has been patterned with a lithography tool at step 118, the wafer can be inspected at step 120. Any conventionally available wafer inspection technique or mechanism can be used for inspecting the wafer. Next, a determination as to whether the wafer includes any defects is performed at step 122. If it is determined that no defects are present in the wafer, then the wafer is allowed to continue along the design process to fabricate the IC device (s) at step 128. However, if it is determined that a defect is present in the wafer, it is subsequently determined at step 124 whether the defect is correctable with a laser. For instance, a defect is correctable with a laser when it is determined that the wafer defect can be mitigated by a change to the effective light transmission through one or more regions of the reticle. Also, if it is determined that a defect is present, the wafer may be discarded.

If the defect is not correctable by use of a laser, step 116 is repeated and the reticle is discarded. However, if the defect is correctable, then the laser may be used to embed "scattering elements" or SEs within the reticle in order to change the light transmission properties of the reticle at specific regions of the reticle. The properties of the SEs (such as density, size, and type) can be based on the inspection results (e.g., CD variation information) received from the wafer inspection 120. After embedding SEs within the reticle, the corrected reticle can be used along with various lithography tools to pattern another wafer at step 118.

It should be noted that the present invention can employ any suitable number and type of reticle and/or wafer inspection or defect review tools. For example, KLA Terascan, TeraStar, Reticle Inspection Tools, AIT-XP, eS20XP, and SL3UV inspection tools, or eV300 and CRS3100 review tools, commercially available from KLA-Tencor of San Jose, Calif., may be employed. Each inspection tool may take the form of an optical system, such as a bright field or dark field optical system. The station may also utilize both bright field and dark field modes. Examples of bright field systems include the 2350, 2351, 2360, and 2370 from KLA-Tencor, Corp. of San Jose, Calif. Examples of dark field system include the AIT II, AIT XP, Fusion, Fusion UV, and SP1 PatternPro available from KLA-Tencor, Corp. of San Jose, Calif. Each tool may also take the form of an electron beam (ebeam) system, such as a scanning, snapshot, or step-and-repeat type ebeam system. A station may be designed to detect special types of defects, such as macro defects across a large area of the sample, defects on a bare substrate, or defects within solder bumps (e.g., ball grid array bumps). Each inspection tool may be a stand alone device or integrated within a processing or lithography tool. Additionally, the laser correction tool (e.g., used to embed SEs in the reticle at step 126) may be a separate device or integrated within any inspection, processing, or lithography tool.

Widening the Process Window

In one application, the laser correction tool may be used to embed scattering centers in a reticle so as to widen the process window of such reticle. A lithography process comprises a set of parameters, such as illumination level (or dose), lens focus, etc. Each parameter has an associated range, such that if the parameters are within their associated ranges, the resulting printed wafer will be within specification tolerances. The collection of lithography parameter values that are within their respective ranges is herein referred to as a "process window."

Considering each parameter as a dimension in the multi-dimensional space given by the lithography parameters, a process window can be visualized as a volume in the multi-dimensional parameter space. It is desirable to make a given process window as wide as possible, since this translates into an increase in the tolerance of the lithography process with respect to parameter variations while still printing a wafer that is within specification tolerances. However, the process window is generally a function of the regions on the lithography mask, and in some mask regions the process window is tighter than in other mask regions. In general, mask regions with tighter or more dense mask patterns have narrower tolerance windows.

In general, the overall process window for any particular mask is given by the intersection of the individual process windows of the various regions on the mask, with the mask generally divided into a finite number of regions which collectively make up the entire mask. Therefore, it is desirable to maximize the intersection (i.e. overlap) of the individual process windows. While this requirement is slightly relaxed in lithography settings where some process parameters such as illumination intensity and focus can be varied as a function of mask region, the available degree of such variation is generally limited, and therefore maximizing the intersection of process windows is desirable even in such lithography settings having the benefit of region-dependent parameter variation.

Figure 2B:
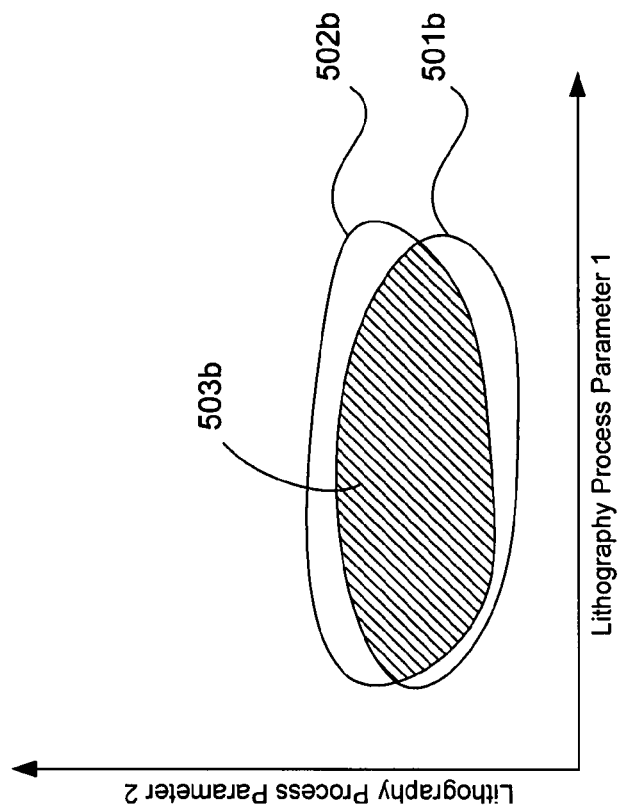
FIG. 2b illustrates the two regions on the reticle of FIG. 2a after the reticle has been modified.
Figure 2A:
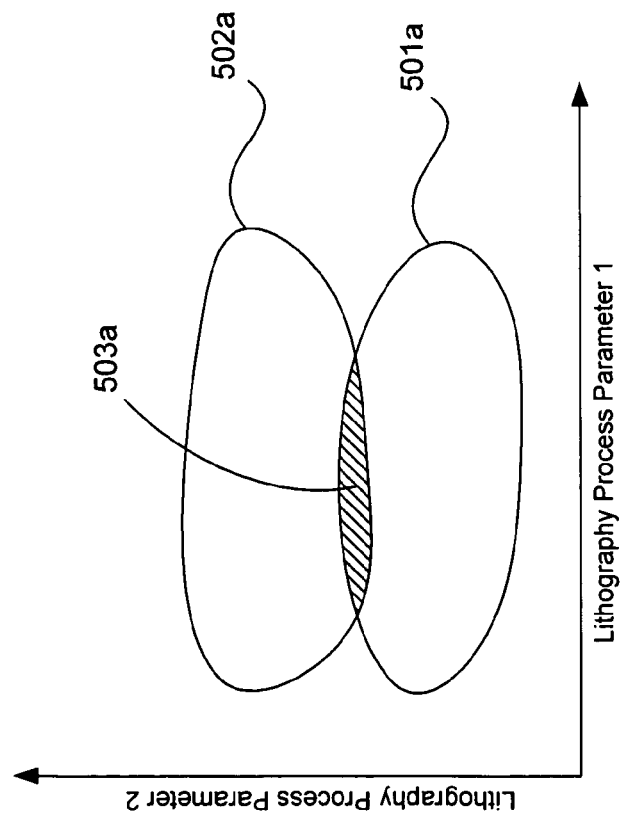
FIG. 2a illustrates two regions on a reticle having two associated process windows.

As an example, consider two particular regions on a lithography mask (for example two rectangular regions on the mask), with the two regions having two associated process windows 501a and 502a, as shown in the diagram of FIG. 2a. As described above, it is generally desirable to modify the mask and move one or more of the process windows 501a and 502a in a way that results in an increase in the overlap the two process windows. The result of one such example mask modification is illustrated in the diagram of FIG. 2b, showing an increase in the overlap 503b between the process window 501b (which has not moved as a result of the mask modification) and the process window 502b (which has moved as a result of the mask modification).

Figure 3B:
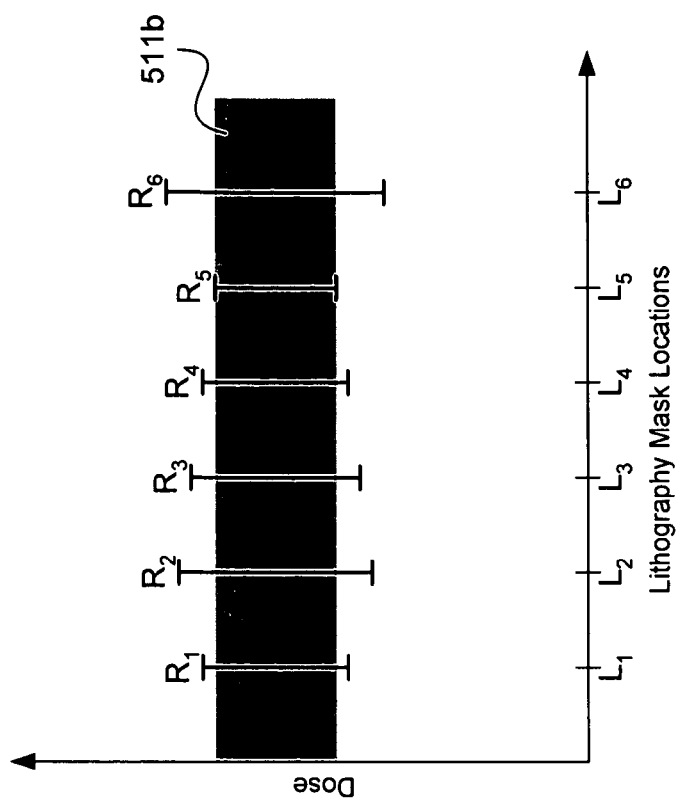
FIG. 3b illustrates example regions on a reticle having different associated dose ranges after adding scattering centers to selected regions in accordance with one embodiment of the present invention.
Figure 3A:
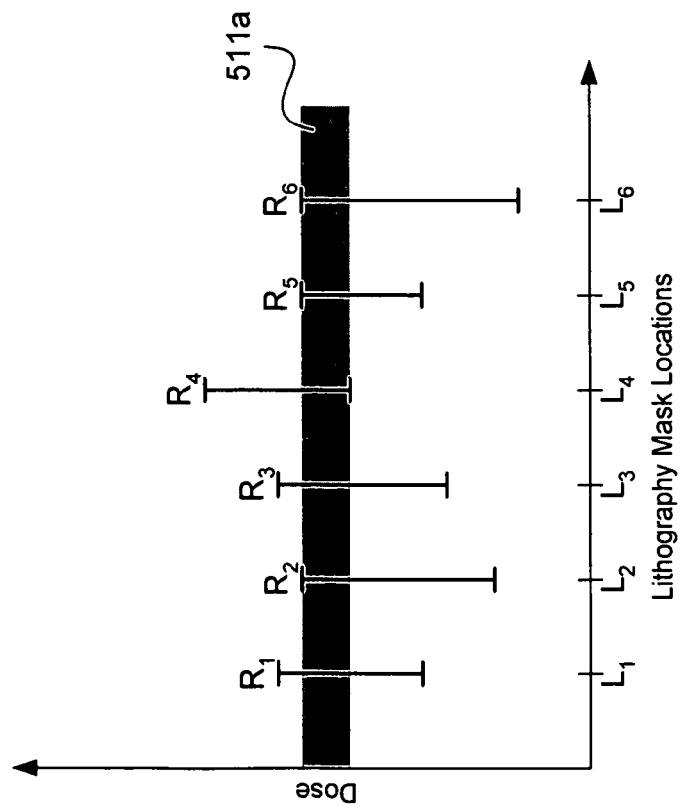
FIG. 3a illustrates example regions on a reticle having different associated dose ranges in accordance with one embodiment of the present invention.

One particular way to achieve this type of mask modification is to use a short-burst laser to embed scattering centers within the mask glass. One particular implementation of this technique is described in above-referenced International Application having Application No. PCT/IL2004/000653 and U.S. Provisional Application No. 60/488,717. Embedding scattering centers in particular region within the mask glass decreases the amount of illumination that is transmitted through the particular mask region onto the wafer. As a result, the range of acceptable illumination intensity through the particular region adjusts upward (i.e. towards higher intensities), since the scattering centers decrease the effective illumination intensity seen at the wafer. The range of acceptable illumination intensity for a particular mask region is referred to as the "dose" associated with that region, and the scattering centers in effect allow an upward adjustment in dose. As an illustrative example, consider a series of example regions $L_1, \ldots, L_6$ on a particular example lithography mask, with each region having an associated dose expressed as ranges $R_1, \ldots, R_6$ and producing an overall process window 511a, as shown in FIG. 3a. Embedding appropriate scattering centers into mask regions $L_1, L_2, L_3, L_5$ and $L_6$ raises their respective dose ranges $R_1, R_2, R_3, R_5$ and $R_6$ and aligns them, thereby increasing the intersection of the dose ranges $R_1, \ldots, R_6$ and widening the overall process window 511b as shown in FIG. 3b.

Detecting and Correcting Global Reticle Variations

As described above, once a reticle is produced according to a design, the reticle is generally inspected and compared to the design. Variations between the actual reticle patterns and the intended design patterns may be of a local or a global nature. While local nanometer level variations are generally addressed by modifying the design in the reticle design database, and micrometer level variations caused by the underlying reticle manufacturing process are generally repaired using reticle repair tools, there are global reticle variations which do not lend themselves to correction by re-design or by using micrometer level repair tools. For example, if a reticle inspection identifies a need for gradual dose reduction across a reticle, for example from the top-left to the bottom-right of the reticle, a global design revision of the reticle may not be an efficient or practical remedy as it may involve revising potentially billions of geometric features in the design database. A more efficient remedy may be provided by modifying the reticle such that it compensates for the global dose variation without the need to first revise the bulk of the reticle design and then manufacture a new reticle based on the revised design. However, in order to repair such global reticle variations, such variations will have to first be properly determined.

While some reticle inspection approaches generally identify and aggregate a set of localized reticle flaws, there are other reticle inspection approaches that identify global trending variations across the reticle, such as reticle variations caused by non-uniformity in the reticle manufacturing process. Some such inspection approaches are described in U.S. Pat. No. 6,516,085 filed May 3, 1999, entitled "APPARATUS AND METHOD FOR COLLECTING GLOBAL DATA DURING A RETICLE INSPECTION" by Wiley et al, and U.S. Pat. No. 6,654,489 filed Dec. 4, 2004, entitled "APPARATUS AND METHOD FOR COLLECTING GLOBAL DATA DURING A RETICLE INSPECTION" by Wiley et al, which patents are incorporated herein by reference.

For instance, the CD map of a reticle may indicate that the feature lines on the reticle are too thin in one or more regions of the reticle, preventing the reticle from blocking an adequate amount of light through the identified reticle regions. When the identified reticle regions are large (for example on a millimeter scale), they may render revision to the design database or repairing the identified reticle flaws too numerous and therefore inefficient and impractical. In such a case, as disclosed by the present invention, instead of repairing a large number of individual reticle flaws, the reticle can be repaired by correcting the dose in such identified reticle regions, thereby allowing the regions to block an adequate amount of light and thereby remedy the identified global-scale reticle flaws. Conversely, the dose through a specific region of the reticle may be effectively increased by increasing the overall dose through the entire reticle as applied by the lithography tool and then decreasing the dose to other regions on the reticle by embedding scattering centers in such other regions. Such dose correction in effect reduces light wherever reticle lines are too thick, which in turn reduces reticle variations and results in a more uniform reticle CD. Note that while in general the reticle is not the only contributor to variations on the wafer CD, it nevertheless is a contributor and accounting for this variable early in the lithography process ultimately contributes to increasing the final wafer fidelity.

One way of correcting the dose in reticle regions comprises embedding scattering centers within identified reticle regions using a laser (such as a femto-second laser), for example as described in the above-referenced International Application having Application No. PCT/IL2004/000653.

Figure 4:
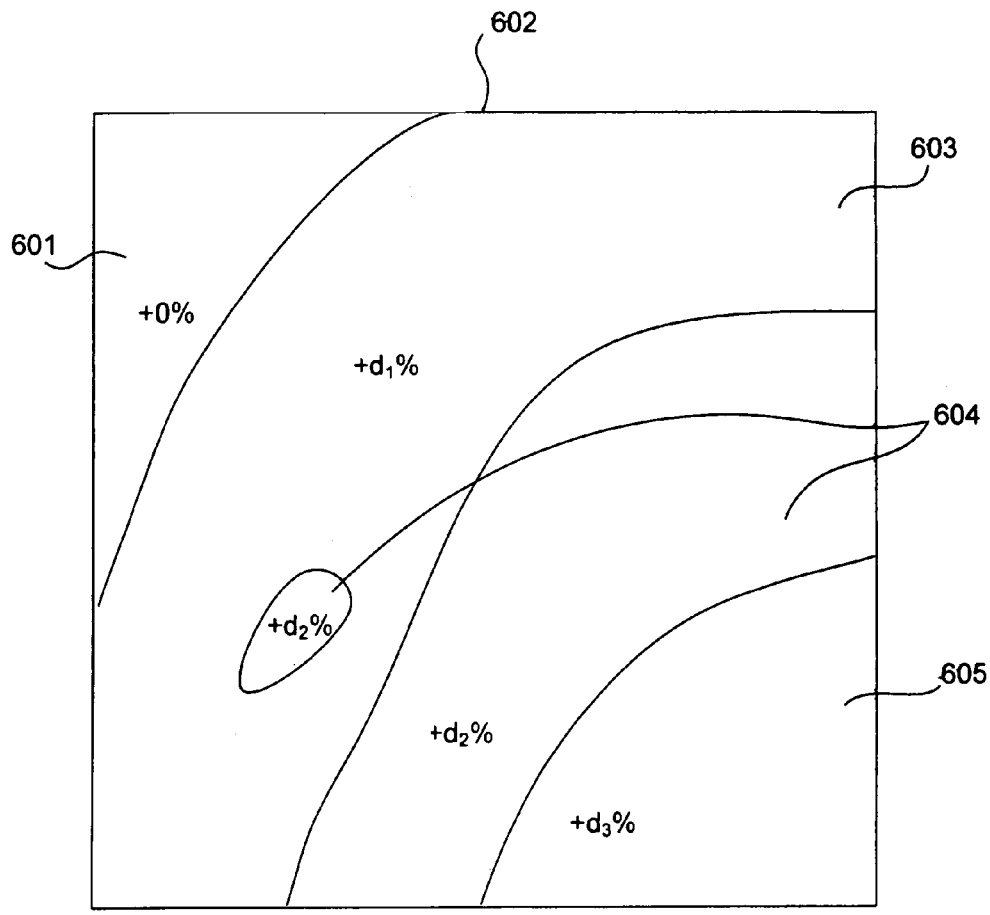
FIG. 4 is a diagrammatic depiction of a reticle exhibiting an exemplary global-scale variation in the thickness of the feature lines (the feature lines are not shown), in accordance with an embodiment of the present invention.

In order to illustrate the above discussion, FIG. 4 shows a diagrammatic depiction of a reticle 601 exhibiting an exemplary global-scale variation in the thickness of the feature lines (the feature lines are not shown). As shown, the general reticle regions 602-605 exhibit a global trend of increasing thickness of feature lines. Region 602 indicates proper dose and does not need dose correction; region 603 indicates a reticle dose level of $+d_1\%$ above desired dose level; the two regions 604 indicate a reticle dose level of $+d_2\%$ above desired dose level; and region 605 indicates a reticle dose level of $+d_3\%$ above desired dose level. Note that the desired dose level are as indicated by the amount of light that would pass through the respective reticle regions had the reticle been manufactured exactly as designed. For example, the particular manufacturing process used may produce a reticle with $d_1=5\%$, $d_2=15\%$ and $d_3=25\%$. Using a dose correction approach, region 603 can be embedded with an appropriate amount of scattering centers in order to reduce the dose by $d_1\%$, thereby adequately compensating for the dose level of this particular manufactured reticle. Similarly, regions 604 and 605 can be embedded with appropriate amounts of scattering centers in order to reduce their dose by $+d_2\%$ and $+d_3\%$, respectively. After a reticle undergoes a change in dose, the overall dose in the subsequent lithography process (in which the reticle is used as a photomask) is adjusted appropriately to compensate for the overall change in reticle dose.

Figure 5:
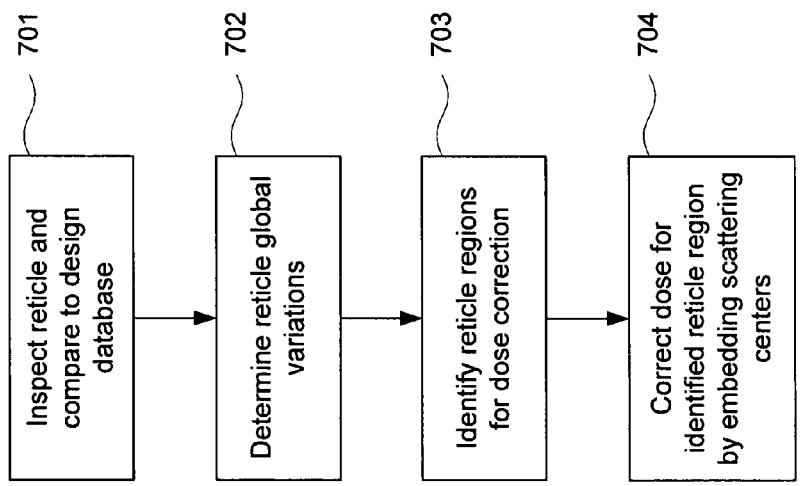
FIG. 5 is a flow diagram illustrating a method for determining and correcting reticle variations, in accordance with an embodiment of the present invention.

FIG. 5 is a flow diagram illustrating a method for determining and correcting reticle variations, in accordance with an embodiment of the present invention. At step 701, a manufactured reticle is inspected by comparing it to its corresponding design database (or any suitable reference). This inspection step may use one or more parameters, such as the amount of light passing through regions of the reticle, or the level of gain that was applied to get the database design (i.e. the geometric shapes in the database) match the actual die (reticle). Note that inspection step 701 in effect compares the actual reticle features (per manufacture) to the intended reticle feature (per design). In other words, the inspection step 701 does not evaluate the merits of the reticle design, but merely determines how well the design is realized in the manufactured reticle.

In general, any suitable inspection process may be utilized to obtain global variations of a particular parameter, such as CD. For example, a test image obtained from the reticle under test may be compared to a reference image obtained from the design database or another image portion of the same or another reticle. The test image may alternatively be in the form of an aerial image that is calculated from light patterns through the reticle under operating conditions set up to emulate the performance of a physical lithography system, instead of being obtained by an inspection imager. Several embodiments of aerial image inspection techniques are described further in U.S. patent application Ser. No. 09/679,617, entitled "METHODS AND SYSTEMS FOR INSPECTING RETICLES USING AERIAL IMAGING AND DIE-TO-DATABASE DETECTION", filed 6 Oct. 2003 by Stokowski et al., which application is incorporated herein by reference in its entirety.

Based on the inspection results of step 701, step 702 determines global variations of the reticle. One exemplary set of global variations was described above in FIG. 2. Based on the determined global variations, step 703 identifies regions of the reticle that will benefit from dose correction. For an identified reticle region, the level of dose correction is set to compensate for the level of variation exhibited by the reticle region, resulting in a "dose map" which identifies reticle regions and their associated levels of dose correction. In general, reticle regions with higher deviation levels benefit from higher levels of dose correction.

The dose map is then used to correct detected variations in order to improve global parameter uniformity across the reticle. In one embodiment, the dose map is communicated to a system which modifies the reticle in order to improve the variations. This is shown at step 704, which comprises modifying the reticle by embedding scattering centers into the identified reticle regions according to their respective levels of dose correction. As described in the above-referenced International Application having Application No. PCT/IL2004/000653, the scattering centers are embedded within the reticle using a laser (such as a femto-second laser). In one specific example, a femto-second laser available from UC-Laser Technologies of Karmiel Israel may be used.

In another embodiment, the dose map (or in general a global variation map identifying reticle regions in need of compensation) is transferred to a system, such as a wafer stepper or scanner, which modifies the conditions under which the reticle is used to manufacture wafers, thereby compensating for the variations and producing wafers that are according to design. One such example comprises modifying the dose in a scanner in the scan direction and along the scanner slit, based on the variation data obtained via reticle inspection.

Foregoing described embodiments of the invention are provided as illustrations and descriptions. They are not intended to limit the invention to precise form described. Other variations and embodiments are possible in light of above teachings, and it is thus intended that the scope of invention not be limited by this Detailed Description, but rather by Claims following.

We claim:

1. A method for determining and correcting reticle variations, comprising:
    comparing one or more measured features of a reticle to one or more reference features;
    determining a reticle global variation based on the comparison, wherein the reticle global variation indicates how a parameter of the reticle varies across the reticle;
    identifying one or more reticle regions for dose correction based on the determined reticle global variation and associating one or more levels of dose correction with the one or more identified reticle regions; and
    applying dose correction to the one or more identified reticle regions according to the associated one or more levels of dose correction so as to minimize the reticle global variation, wherein the operation of applying dose correction comprises embedding scattering centers into the reticle at the identified one or more reticle regions using an optical beam so as to alter a transmission level through such identified one or more reticle regions.

2. The method of claim 1, wherein the operation of embedding scattering centers is accomplished by using a femto-second laser.

3. The method of claim 1, wherein the one or more reference features are obtained from a design database.

4. The method of claim 1, wherein the one or more measured features of the reticle are measured on a first die of the reticle and the one or more reference features are measured on a second die of the reticle.

5. The method of claim 1, wherein the one or more reference features are previously measured on a second reticle having ideal characteristics.

6. The method of claim 1, wherein the parameter is critical dimension (CD), wherein when the CD of a first reticle region is greater than a CD of the corresponding reference region, the dose correction for such first reticle region specifies a decrease in the dose level so as to decrease the CD of the first reticle region to substantially match the CD of the corresponding reference region.

7. The method of claim 1, wherein the parameter is critical dimension (CD), wherein when the CD of a first reticle region is less than a CD of the corresponding reference region and the CD of a second reticle region is not less than a CD of the corresponding reference region, the dose correction for the second reticle region specifies a decrease in the dose level for the second reticle region, the method further comprising specifying an increase in the dose level applied to the entire reticle, including the first and second reticle regions, so that the resulting dose level that transmits through the first region increases so as to increase the CD of the first region to substantially match the CD of the corresponding reference region and the resulting dose level that transmits through the second reticle region remains the same.

8. The method of claim 1, wherein the reticle regions are on a millimeter scale.

9. The method of claim 1, wherein the operation of identifying one or more reticle regions for dose correction is accomplished by providing a dose map.

10. A method for modifying a reticle having a plurality of regions that each have a plurality of patterned structures, comprising:

providing a process window for each of the reticle regions, wherein each process window specifies a range of lithography parameters for which the corresponding reticle region prints a particular wafer region that is within a predetermined specification; and embedding one or more scattering centers within a first one of the reticle regions so as to widen the first reticle region's corresponding process window, wherein the scattering centers are sized and positioned to alter a transmission property of the first reticle region.

11. The method of claim 10, wherein the operation of embedding one or more scattering centers is performed so as to increase an overlap between the first reticle region's corresponding process window and at least a second one of the reticle region's corresponding process window.

12. The method of claim 10, wherein the operation of embedding one or more scattering centers is accomplished by using a femto-second laser.

13. The method as recited in claim 10, wherein the scattering centers are sized and positioned so as to decrease the amount of illumination through the first reticle region to thereby allow an increase in dose level of the first reticle region's process window.

* * * * *